US010895018B2

(12) United States Patent
Narushima et al.

(10) Patent No.: US 10,895,018 B2
(45) Date of Patent: Jan. 19, 2021

(54) METHOD FOR PRODUCING SILICON SINGLE CRYSTAL

(71) Applicant: SUMCO CORPORATION, Tokyo (JP)

(72) Inventors: Yasuhito Narushima, Tokyo (JP); Toshimichi Kubota, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 90 days.

(21) Appl. No.: 16/310,232

(22) PCT Filed: Apr. 18, 2017

(86) PCT No.: PCT/JP2017/015548
§ 371 (c)(1),
(2) Date: Dec. 14, 2018

(87) PCT Pub. No.: WO2017/217104
PCT Pub. Date: Dec. 21, 2017

(65) Prior Publication Data
US 2019/0249331 A1   Aug. 15, 2019

(30) Foreign Application Priority Data

Jun. 17, 2016  (JP) ................................ 2016-120817

(51) Int. Cl.
| *C30B 15/10* | (2006.01) |
| *C30B 15/22* | (2006.01) |
| *C30B 29/06* | (2006.01) |
| *C30B 15/20* | (2006.01) |
| *C30B 15/14* | (2006.01) |

(52) U.S. Cl.
CPC .............. *C30B 15/22* (2013.01); *C30B 15/14* (2013.01); *C30B 15/20* (2013.01); *C30B 29/06* (2013.01)

(58) Field of Classification Search
CPC .......... C30B 15/00; C30B 15/02; C30B 15/10
See application file for complete search history.

(56) References Cited

U.S. PATENT DOCUMENTS

| 9,634,098 B2* | 4/2017 | Falster .................. H01L 21/223 |
| 10,227,710 B2 | 3/2019 | Narushima et al. |
| 2003/0047130 A1* | 3/2003 | Sreedharamurthy ... C30B 15/22 |
| | | 117/13 |

(Continued)

FOREIGN PATENT DOCUMENTS

| DE | 11 2005 000 715 B4 | 2/2016 |
| DE | 11 2006 002 595 B4 | 3/2018 |

(Continued)

OTHER PUBLICATIONS

Office Action for DE 11 2017 003 016.1 dated Oct. 12, 2020 (w/ translation).

*Primary Examiner* — Robert M Kunemund
(74) *Attorney, Agent, or Firm* — Greenblum & Bernstein, P.L.C.

(57) ABSTRACT

A production method of a monocrystalline silicon includes: forming a shoulder of the monocrystalline silicon; and forming a straight body of the monocrystalline silicon. To form the shoulder, a crucible is heated such that a heating ratio, which is calculated by dividing a volume of heat from a lower heater by a volume of heat from an upper heater, increases from a predetermined value of 1 or more.

4 Claims, 5 Drawing Sheets

(56) References Cited

U.S. PATENT DOCUMENTS

| | | |
|---|---|---|
| 2004/0211359 A1 | 10/2004 | Shiraishi et al. |
| 2005/0139149 A1 | 6/2005 | Maeda et al. |
| 2007/0227439 A1 | 10/2007 | Yokoyama et al. |
| 2016/0102419 A1 | 4/2016 | Jeon |

FOREIGN PATENT DOCUMENTS

| | | |
|---|---|---|
| JP | 2002-255683 A | 9/2002 |
| JP | 2004-043252 A | 2/2004 |
| JP | 2008-297167 A | 12/2008 |
| JP | 2011-051805 A | 3/2011 |
| JP | 2015-526380 A | 9/2015 |
| JP | 2016-183071 A | 10/2016 |
| WO | 03/029533 A1 | 4/2003 |

* cited by examiner

METHOD FOR PRODUCING SILICON SINGLE CRYSTAL

TECHNICAL FIELD

The present invention relates to a production method of a monocrystalline silicon.

BACKGROUND ART

Low-resistive monocrystalline silicons have recently been demanded. In a known production method of such monocrystalline silicons where an n-type dopant is densely added; single crystallization is sometimes hampered and thus studies have been conducted on prevention of such a problem (see, for instance, Patent Literature 1).

Patent Literature 1 discloses that addition of a large amount of the dopant significantly increases a freezing-point depression to cause compositional supercooling and an abnormal growth (Cell growth), which is different from a silicon growth on a silicon growth face, is induced on a crystal growth interface when such compositional supercooling is large, hampering single crystallization.

According to the production method of Patent Literature 1, which takes into account that a temperature gradient in a silicon melt cannot be directly measured, a monocrystalline silicon is produced such that a predetermined relationship is satisfied between a temperature gradient of the monocrystalline silicon, which is referred to instead of the temperature gradient in the silicon melt, a dopant concentration in the silicon melt, a pull-up speed, and a coefficient corresponding to a dopant type.

CITATION LIST

Patent Literature(S)

Patent Literature 1 JP 2008-297167 A

SUMMARY OF THE INVENTION

Problem(s) to be Solved by the Invention

However, dislocation sometimes occurs at an early stage of crystal growth in the process of producing the monocrystalline silicon to hamper single crystallization, which has proven that the method of Patent Literature 1 cannot always prevent the problem.

An object of the invention is to provide a monocrystalline silicon production method capable of producing a monocrystalline silicon with a stable quality.

Means for Solving the Problem(s)

After dedicated studies, the inventors have found the following.

It has been found that an abnormal growth occurs on a surface of the shoulder of a monocrystalline silicon with dislocation. A research for the cause of the abnormal growth has revealed that the abnormal growth is attributed to compositional supercooling. The compositional supercooling has proven to occur when the following formula (1) is satisfied, where $G_L$ (K/mm) denotes a temperature gradient of a dopant-added melt (a silicon melt added with a dopant) under a solid-liquid interface, V (mm/min) denotes a pull-up speed for a monocrystalline silicon, m (K·cm³/atoms) denotes a freezing-point depression, $C_0$ (atoms/cm³) denotes a dopant concentration in the dopant-added melt, D (cm²/sec) denotes a diffusion coefficient, and $k_0$ denotes a segregation coefficient.

Formula 1

$$\frac{G_L}{V} \leq \frac{mC_0}{D} \cdot \frac{(1-k_0)}{k_0} \quad (1)$$

Among the factors in the formula (1), the temperature gradient $G_L$, pull-up speed V, and dopant concentration $C_0$ can be controlled in producing a monocrystalline silicon. Accordingly, studies have been conducted in terms of temperature gradient $G_L$, revealing that the abnormal growth can be reduced by applying a larger volume of heat to a lower part of the crucible than to an upper part of the crucible during the formation of the shoulder. The mechanism for reducing the abnormal growth is speculated as follows.

A surface of the dopant-added melt tends to be affected by a lot of factors making the surface temperature of the dopant-added melt unstable, such as heat extraction by purge gas and vaporization heat resulting from evaporation of the dopant. As shown in FIG. 1, it is speculated that when the dopant-added melt MD with an unstable liquid temperature enters the solid-liquid interface as shown by an arrow F as a result of the surface temperature of the dopant-added melt MD becoming unstable, the liquid temperature changes to destabilize the crystal growth and, consequently, cause the abnormal growth.

Accordingly, the volume of heat applied to the lower part of the crucible 22 is set larger than the volume of heat applied to the upper part to enhance a convection H, which rises upward from the bottom of the crucible 22 and flows toward the outside of the crucible 22 after reaching the underneath of the solid-liquid interface. This increases the temperature gradient $G_L$. It is thus speculated that the convection H, which flows in the opposite direction to the arrow F, serves to reduce a melt with an unstable liquid temperature from entering the solid-liquid interface, so that a melt with a relatively stable liquid temperature rising upward from the bottom enters the solid-liquid interface to reduce the abnormal growth.

The invention has been made in view of the above findings.

According to an aspect of the invention, a production method of a monocrystalline silicon according to a Czochralski process with use of a monocrystal pull-up apparatus, which includes: a chamber; a crucible located in the chamber; a heater configured to heat the crucible to produce a dopant-added melt including a silicon melt and a dopant added to the silicon melt; and a pull-up unit configured to pull up a seed crystal after bringing the seed crystal into contact with the dopant-added melt, the heater including an upper heater configured to heat an upper side surface of the crucible and a lower heater configured to heat a lower side surface of the crucible, includes: forming a shoulder of the monocrystalline silicon; and forming a straight body of the monocrystalline silicon. In forming the shoulder, the shoulder is formed by heating the crucible such that a heating ratio, which is calculated by dividing a volume of heat from the lower heater by a volume of heat from the upper heater, increases from a predetermined value of 1 or more.

In the above aspect, the heating ratio is set larger than 1 (i.e. the volume of heat from the lower heater is set larger than the volume of heat from the upper heater) to reduce the occurrence of an abnormal growth in the shoulder as described above, thus producing a monocrystalline silicon with a stable quality, where no dislocation occurs in either the shoulder or the straight body.

In the above aspect, it is preferable that in forming the shoulder, the shoulder is formed by heating the crucible such that the heating ratio becomes 2 or more.

In the above aspect, a monocrystalline silicon SM with a more stable quality can thus be produced.

In the above aspect, it is preferable that the production method of the monocrystalline silicon further includes forming a neck of the monocrystalline silicon and, in forming the neck, the seed crystal is brought into contact with the dopant-added melt while the crucible is heated such that the heating ratio becomes 1.5 or less.

When the heating ratio before the seed crystal is brought into contact with the dopant-added melt exceeds 1.5, radiation of heat from the dopant-added melt to the seed crystal caused by heating the upper part of the crucible is reduced, which may result in insufficiently heating the seed crystal. In this case, a difference in temperature between the seed crystal and the dopant-added melt becomes large, so that dislocation (heat shock dislocation) may be caused in the neck by a heat shock upon contact between the seed crystal and the dopant-added melt. The heat shock dislocation may result in the occurrence of dislocation in the shoulder and the straight body.

In the above aspect, radiation of heat from the dopant-added melt to the seed crystal resulting from heating the upper part of the crucible can be increased to reduce a difference in temperature between the seed crystal and the dopant-added melt. This allows for reducing occurrence of heat shock dislocation in the neck and, consequently, reducing occurrence of dislocation in the shoulder and the straight body resulting from the heat shock dislocation.

In the above aspect, it is preferable that in forming of the shoulder, the crucible is heated such that the heating ratio increases from a predetermined value of 1.5 or less until a timing when a diameter of the shoulder being formed reaches a half of a target diameter of the straight body or more and, at or after the timing, heated such that the heating ratio becomes 2 or more.

When the diameter of the shoulder is less than a half of the target diameter of the straight body, the dopant-added melt has a relatively large surface area, so that a large amount of a melt with an unstable liquid temperature enters the solid-liquid interface. Even when the heat ratio is set at 2 or more at such a timing, the convection H, which flows toward the outside of the crucible, cannot block the melt with an unstable liquid temperature from entering the solid-liquid interface. Thus, an abnormal growth is unlikely to be reduced.

In the above aspect, the heating ratio is set at 2 or more at a timing when the diameter of the shoulder is a half of the target diameter of the straight body with a small amount of a melt with an unstable liquid temperature entering the solid-liquid interface. This allows the convection H to keep the melt with an unstable liquid temperature from entering the solid-liquid interface, increasing the possibility of reducing an abnormal growth.

BRIEF DESCRIPTION OF DRAWING(S)

FIG. 1 illustrates a mechanism for reducing an abnormal growth.

FIG. 2 schematically shows an arrangement of a monocrystal pull-up apparatus according to an exemplary embodiment of the invention.

DESCRIPTION OF EMBODIMENT(S)

Exemplary Embodiment(s)

Figure 1:
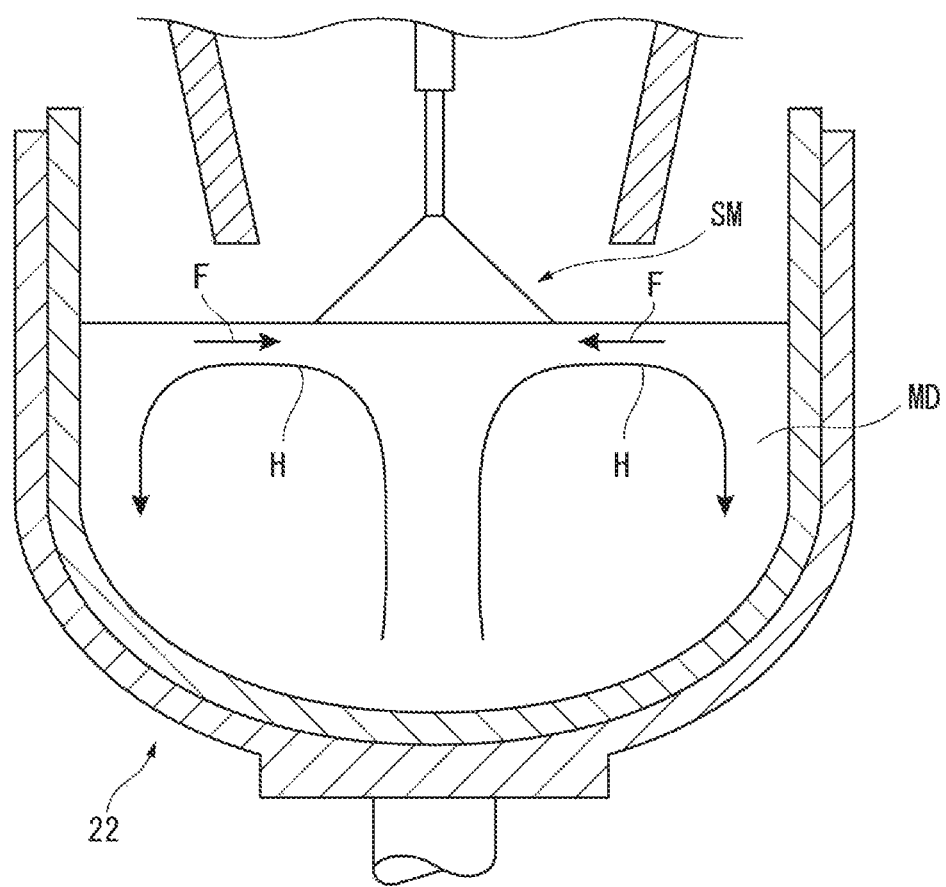
Figure 2:
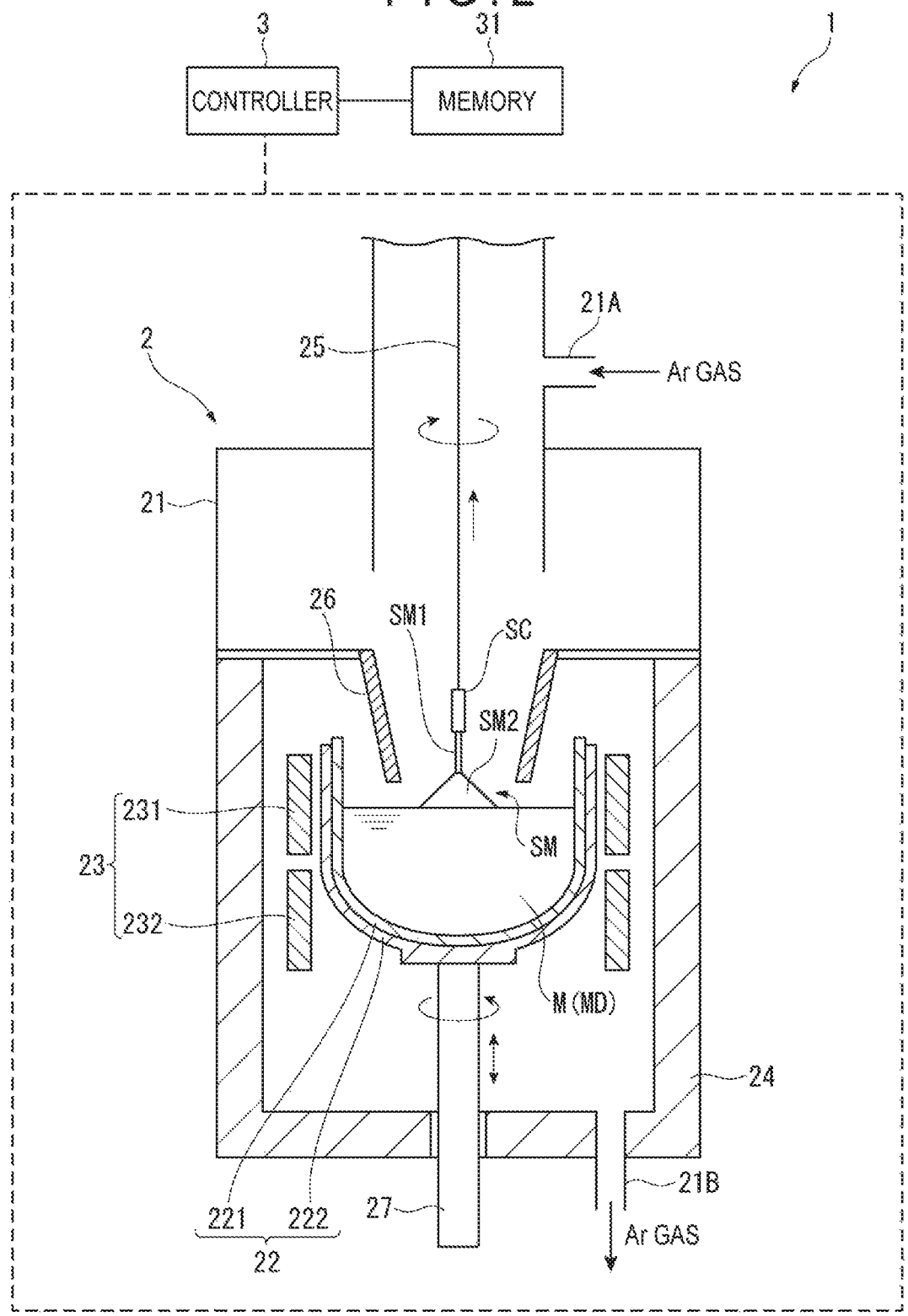

An Exemplary embodiment of the invention will be described below with reference to the attached drawings.
Arrangement of Monocrystal Pull-Up Apparatus As shown in FIG. 2, a monocrystal pull-up apparatus 1, which is an apparatus usable for the CZ (Czochralski) process, includes a pull-up apparatus body 2 and a controller 3.

The pull-up apparatus body 2 includes a chamber 21, a crucible 22 located at a center in the chamber 21, a heater 23 configured to heat the crucible 22, a heat insulating cylinder 24, a pull-up cable 25 (a pull-up unit), and a heat shield 26.

A gas inlet 21A through which an inert gas (e.g. Ar gas) is introduced into the chamber 21 is provided at an upper part of the chamber 21. A gas outlet 21B through which the gas in the chamber 21 is discharged when a vacuum pump (not shown) is driven is provided at a lower part of the chamber 21.

The inert gas is introduced at a predetermined gas flow rate into the chamber 21 through the gas inlet 21A at the upper part of the chamber 21 under the control of the controller 3. The introduced gas is then discharged through the gas outlet 21B at the lower part of the chamber 21 after flowing inside the chamber 21 from the upper side toward the lower side.

A pressure (furnace pressure) inside the chamber 21 is to be controlled by the controller 3.

The crucible 22 is configured to melt polycrystalline silicon (i.e. a material of a silicon wafer) to provide a silicon melt M. The crucible 22 is supported by a support shaft 27 rotatable at a predetermined speed and vertically movable. The crucible 22 includes a cylindrical quartz crucible 221 with a closed bottom and a support crucible 222 made of a carbon material that houses the quartz crucible 221.

The heater 23 is located in the vicinity of the crucible 22 to melt the silicon inside the crucible 22. The heater 23 includes an upper heater 231 configured to heat an upper side surface of the crucible 22 and a lower heater 232, which is located below the upper heater 231, configured to heat a lower side surface of the crucible 22.

The heat insulating cylinder 24 is located around the crucible 22 and the heater 23.

The pull-up cable 25 has a first end connected to a pull-up driver (not shown) located above the crucible 22 and a second end attached with a seed crystal SC. The pull-up cable 25 is vertically movable at a predetermined speed and rotatable around an axis of the pull-up cable 25 under the control by the controller 3.

The heat shield 26 is configured to block radiant heat radiated upward from the heater 23.

The controller 3 is configured to control, for instance, the gas flow rate and the furnace pressure in the chamber 21, the temperature of heat applied to the crucible 22 by the heater 23, and the respective rotation speeds of the crucible 22 and the monocrystalline silicon SM based on information stored in a memory 31, an input by an operator or the like to produce the monocrystalline silicon SM.

Production Method of Monocrystalline Silicon

Next, description will be made on a production method of the monocrystalline silicon SM.

It should be noted that a straight body of the monocrystalline silicon SM to be produced exemplarily has a target diameter R of 200 mm in the exemplary embodiment, but the monocrystalline silicon SM with any different target diameter such as 300 mm and 450 mm may be produced.

First, the controller 3 of the monocrystal pull-up apparatus 1 sets production conditions for the monocrystalline silicon SM, such as resistivity, oxygen concentration, Ar flow rate, furnace pressure, respective rotation speeds of the crucible 22 and the monocrystalline silicon SM, and a heating ratio between the upper heater 231 and the lower heater 232. The production conditions may be inputted by an operator or calculated by the controller 3 based on, for instance, a target oxygen concentration inputted by an operator.

The resistivity preferably ranges from 1.5 mΩ·cm to 3.5 mΩ·cm in the use of arsenic as the dopant and preferably from 0.6 mΩ·cm to 1.2 mΩ·cm in the use of red phosphorus as the dopant.

Next, the controller 3 controls the upper heater 231 and the lower heater 232 based on the set value of the heating ratio to heat the crucible 22, thereby melting the polycrystalline silicon material (silicon material) and the dopant in the crucible 22 to produce a dopant-added melt MD. The controller 3 then controls the monocrystal pull-up apparatus 1 to introduce an Ar gas at a predetermined flow rate into the chamber 21 through the gas inlet 21A and reduce the pressure in the chamber 21 so that an inert atmosphere under the reduced pressure is kept in the chamber 21.

The controller 3 then performs a neck-formation step, a shoulder-formation step, a straight-body-formation step and a tail-formation step.

In the neck-formation step, the heating ratio is set at 1 (i.e. the volume of heat applied to the upper part of the crucible 22 is set equal to the volume of heat applied to the lower part) and the pull-up cable 25 is moved downward to immerse the seed crystal SC into the dopant-added melt MD after the liquid temperature becomes stable. The controller 3 then controls the monocrystal pull-up apparatus 1 to pull up the pull-up cable 25 while rotating the crucible 22 and the pull-up cable 25 in a predetermined direction, thus forming a neck SM1. It should be noted that the rotation speed of the crucible 22 in the neck-formation step is preferably the same as one at the beginning of the shoulder-formation step. Further, the heating ratio in the neck-formation step may be larger than 1.0 but at most 1.5.

Figure 3A:
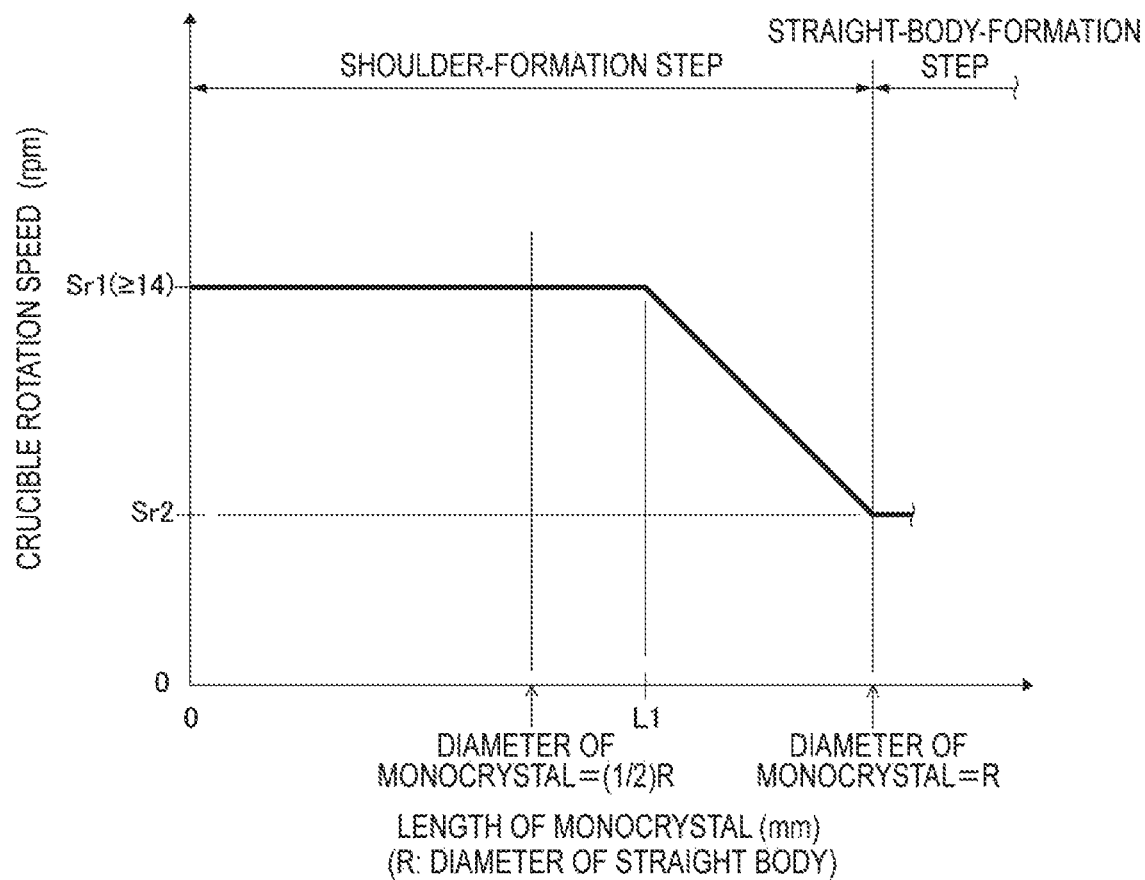
FIG. 3A shows production conditions according to the exemplary embodiment, in particular, a relationship between a length of a monocrystalline silicon and a rotation speed of a crucible.

In the shoulder-formation step, a shoulder SM2 is formed in a manner to prevent occurrence of an abnormal growth in the shoulder SM2. Specifically, as shown in FIG. 3A, the controller 3 controls the monocrystal pull-up apparatus 1 to pull up the pull-up cable 25 while rotating the crucible 22 at a rotation speed Sr1 (Sr1≥14 rpm). Sr1 can be set at any value equal to or more than 14 rpm but preferably 30 rpm or less. This is because Sr1 exceeding 30 rpm destabilizes the operation of the monocrystal pull-up apparatus 1 to cause deformation of the shoulder SM2. It should be noted that the abscissa axis in each of FIGS. 3A, 3B, 4A and 4B represents a length of the monocrystalline silicon SM excluding the neck SM1.

Subsequently, the rotation speed, which has been maintained at Sr1, starts being gradually reduced at a predetermined timing when a diameter of the pulled monocrystalline silicon SM (shoulder SM2) reaches (½) R (half of the target diameter of the straight body) or more (i.e. the length of the monocrystalline silicon SM reaches L1). Specifically, the rotation speed is linearly reduced such that the rotation speed reaches Sr2, which is suitable for forming the straight body, when the diameter of the monocrystalline silicon SM becomes R (i.e. when the formation of the shoulder SM2 is completed). It should be noted that Sr2 preferably ranges from 4 rpm to 12 rpm. This is because Sr2 of less than 4 rpm destabilizes the dopant-added melt MD to cause dislocation and Sr2 exceeding 12 rpm increases variations in an in-plane distribution of oxygen concentration and resistivity in the monocrystalline silicon SM to destabilize a crystal quality. The rotation speed may be maintained at Sr1 throughout the shoulder-formation step.

Figure 3B:
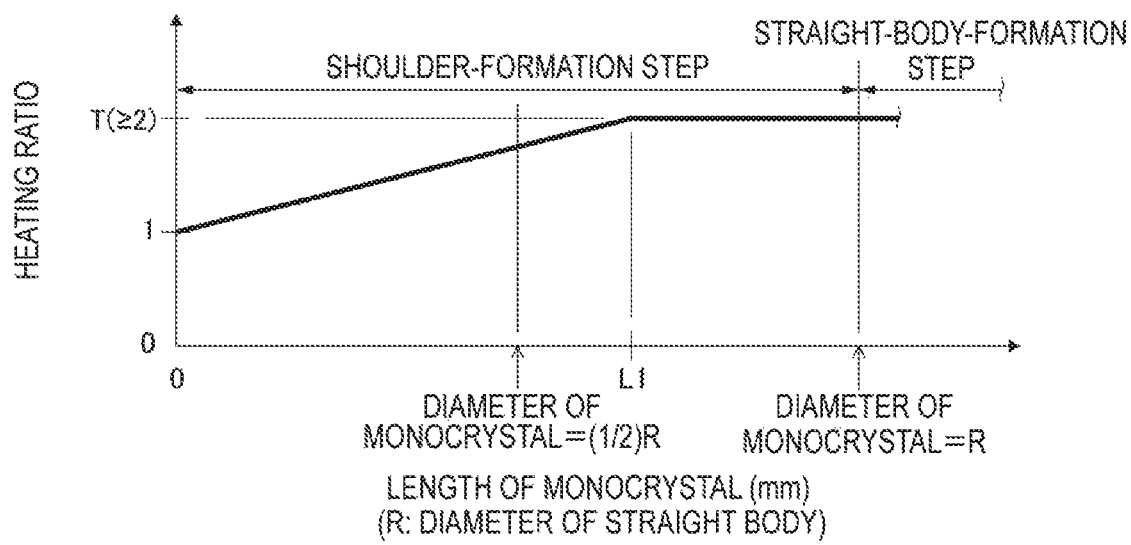
FIG. 3B shows production conditions according to the exemplary embodiment, in particular, a relationship between the length of the monocrystalline silicon and a heating ratio.

As shown in FIG. 3B, the controller 3 gradually increases the heating ratio from 1 while the rotation speed is maintained at Sr1. Specifically, the heating ratio is linearly increased such that the heating ratio becomes T (≥2) when the length of the monocrystalline silicon SM reaches L2. The heating ratio is then maintained at T until the completion of the formation of the shoulder SM2.

It should be noted that T is preferably equal to or less than 4. At a heating ratio exceeding 4, a large heat load on the lower part of the crucible 22 may cause deformation of the crucible 22 and/or peeling of quartz.

Subsequently, the straight-body-formation step and the tail-formation step are performed, thus completing the production of the monocrystalline silicon SM.

Advantage(s) of Exemplary Embodiment(s)

In the exemplary embodiment, the crucible 22 is heated such that the heating ratio becomes 2 or more to perform the shoulder-formation step, thus reducing the occurrence of an abnormal growth in the shoulder SM2. Consequently, no dislocation occurs in the shoulder SM2 and the straight body, so that the monocrystalline silicon SM with a stable quality can be produced.

Further, the crucible 22 is heated such that the heating ratio becomes 1.5 or less in bringing the seed crystal SC into contact with the dopant-added melt MD, thus reducing the occurrence of heat shock dislocation in the neck SM1 and, consequently, the occurrence of dislocation in the shoulder SM2 and the straight body.

Further, in the shoulder-formation step, the heating ratio is gradually increased from a value equal to or less than 1.5 to reach 2 or more at a timing when the diameter of the shoulder SM2 becomes ½R or more and then maintained at 2, thus increasing the possibility of reducing an abnormal growth.

Similarly, in the straight-body-formation step, a rotation of the crucible at 14 rpm or more is likely to cause uneven in-plane distribution of, for instance, the oxygen concentration and the resistivity of the straight body. However, the rotation speed is maintained at Sr1 until the diameter of the shoulder SM2 reaches ½R and gradually reduced at a predetermined timing when the diameter becomes ½R or more, thus reducing not only the occurrence of dislocation in the straight body but also uneven distribution of the oxygen concentration and resistivity.

Modification(s)

It should be understood that the scope of the invention is not limited by the above exemplary embodiment, but various improvements and modifications compatible with the invention are possible and, further, specific processes, arrangements and the like in the practice of the invention may be changed as long as an object of the invention is achievable.

Figure 4A:
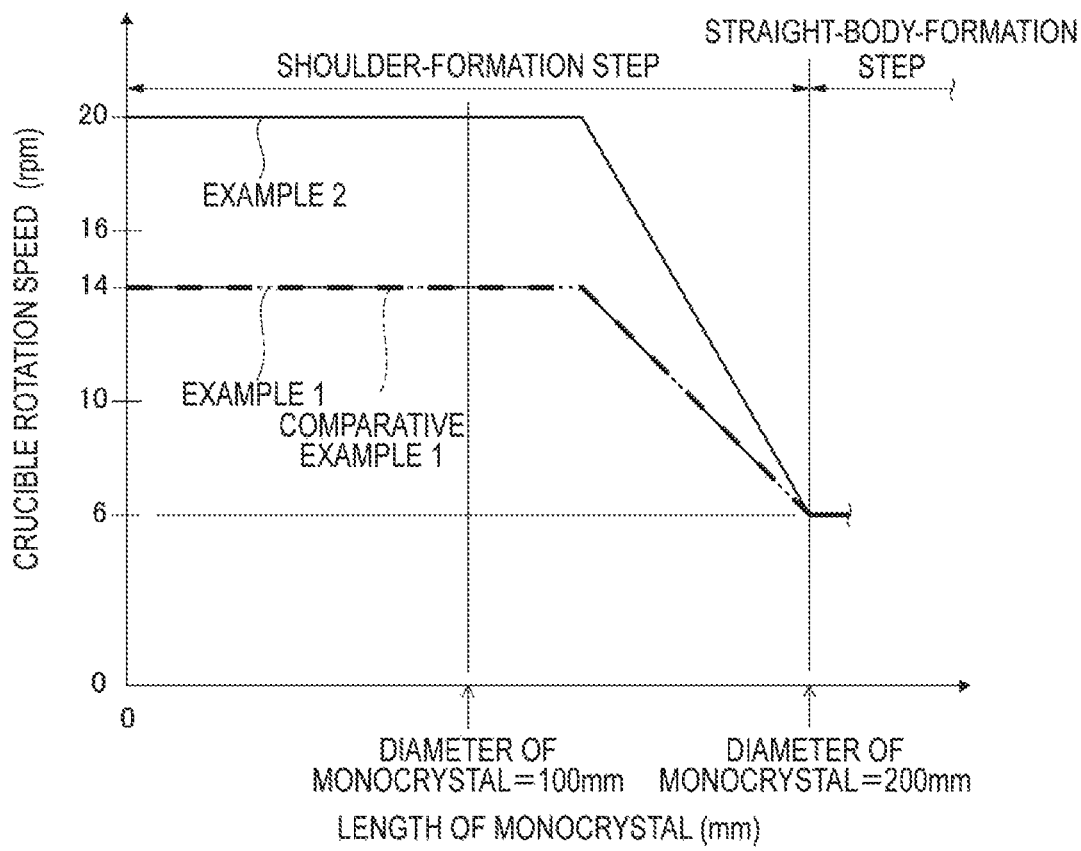
FIG. 4A shows production conditions for Experiment 1 in Examples, in particular, a relationship between the length of the monocrystalline silicon and the rotation speed of the crucible.
Figure 4B:
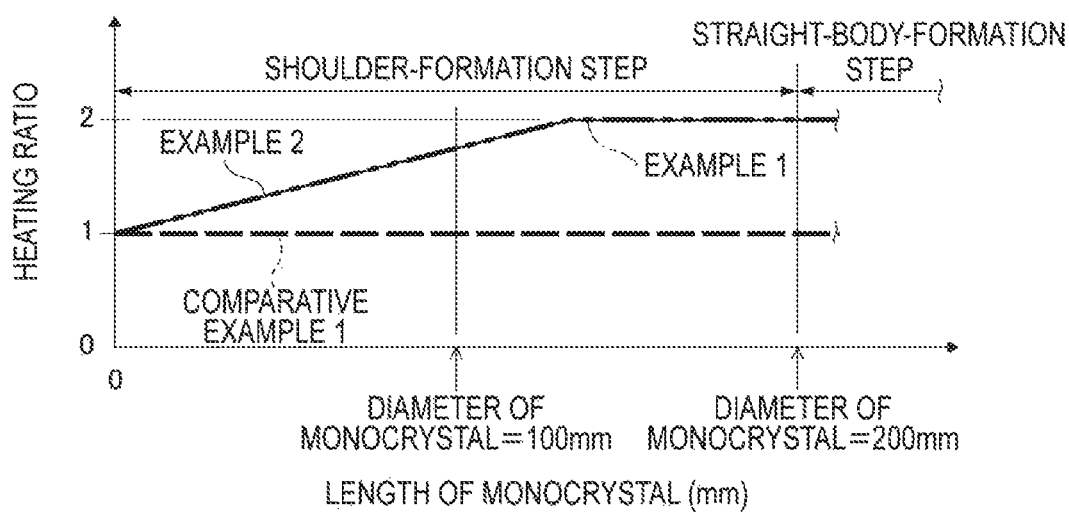
FIG. 4B shows production conditions for Experiment 1 in Examples, in particular, a relationship between the length of the monocrystalline silicon and the heating ratio.

The heating ratio is exemplarily gradually increased from a predetermined value equal to or more than 1 in a linear manner as shown in FIGS. 3B and 4B but may be increased in a different manner. In some exemplary embodiments, the rotation speed is increased in a non-linear or stepwise manner.

EXAMPLE(S)

Next, the invention will be described in more detail below with reference to Examples. However, it should be noted that the scope of the invention is by no means limited by these Examples.

Experiment 1: Relationship Between Rotation Speed of Crucible, Heating Ratio, and Dislocation In Experiment 1, monocrystalline silicons with the following characteristics were produced and evaluated.

Target diameter of the straight body: 200 mm

Dopant: arsenic

Resistivity: 2.0 mΩ·cm

Production Method of Monocrystalline Silicon

Comparative Example 1

As shown in FIG. 4A and Table 1, in the shoulder-formation step, the rotation speed was controlled such that the cable was pulled up with the crucible being rotated at a rotation speed of 14 rpm and the rotation speed started being gradually reduced at the timing when the diameter of the monocrystalline silicon became 100 mm (a half of the target diameter of the straight body) or more to reach 6 rpm at the completion of the formation of the shoulder. The heating ratio was set constant at 1 as shown in FIG. 4B and Table 1. Subsequently, the straight-body-formation step and the tail-formation step were performed.

In the process of production, the monocrystalline silicon was observed to find whether any dislocation occurred. When dislocation occurred, the pull-up operation was stopped and the monocrystalline silicon was melted in a dopant-added melt (a melt-back step). The above process was then repeated until a monocrystalline silicon including a straight body with no dislocation was produced. Table 1 shows the frequency of pulling up (try' frequency), the frequency of occurrence of dislocation (dislocation frequency), and the incidence of dislocation (dislocation rate=dislocation frequency/try frequency).

TABLE 1

|  | Comp. 1 | Ex. 1 | Ex. 2 |
| --- | --- | --- | --- |
| Rotation Speed of Crucible (rpm) | 14→6 | 14→6 | 20→6 |
| Heating Ratio | 1 | 1→2 | 1→2 |
| Try Frequency | 6 | 3 | 20 |
| Dislocation Frequency | 4 | 0 | 0 |
| Dislocation Rate | 67% | 0% | 0% |

Example 1

A monocrystalline silicon was produced under the same conditions as in Comparative Example 1 except that the heating ratio was controlled such that the cable was pulled up with the crucible being heated at a heating ratio of 1 while being rotated in the same manner as in Comparative Example 1, the heating ratio started being gradually increased immediately after the pull-up operation to reach 2 at a timing when the rotation speed started being reduced, and then the rotation speed was maintained at 2 until the completion of the formation of the shoulder. Table 1 shows the try frequency, dislocation frequency, and dislocation rate.

Example 2

A monocrystalline silicon was produced under the same conditions as in Example 1 except that the crucible was rotated at 20 rpm during the period when the crucible was rotated at 14 rpm in Example 1. Table 1 shows the try frequency, dislocation frequency, and dislocation rate.

Evaluation

As shown in Table 1, dislocation sometimes occurred in the monocrystalline silicon in Comparative Example 1, whereas no dislocation occurred in any portion in Examples 1 and 2. This has proven that a monocrystalline silicon with no dislocation can be produced by heating the crucible such that the heating ratio becomes 2 or more in forming the shoulder (i.e. gradually increasing the heating ratio from 1 to reach 2 or more at a timing when the diameter of the shoulder reaches ½R or more) and then maintaining the heating ratio of 2.

Experiment 2: Relationship Between Resistivity of Dopant, Heating Ratio, and Dislocation In Experiment 2, monocrystalline silicons with the following characteristics were produced and evaluated.

Target diameter of the straight body: 200 mm

Dopant: see Table 2

Resistivity: see Table 2

TABLE 2

|  | Dopant | Resistivity (mΩ · cm) |
| --- | --- | --- |
| Reference Example 1 | Arsenic | 3.0 |
| Reference Example 2 | Arsenic | 1.8 |
| Reference Example 3 | Red Phosphorus | 1.3 |
| Reference Example 4 | Red Phosphorus | 0.7 |

For Reference Examples 1 to 4, the monocrystalline silicons were produced by, in the shoulder-formation step, controlling the rotation speed of the crucible within a range from 14 rpm to 20 rpm as shown in FIGS. 4A and 4B and the heating ratio within a range from 1 to 2 as shown in FIGS. 4A and 4B and, subsequently, performing the straight-body-formation step and the tail-formation step.

Figure 5:
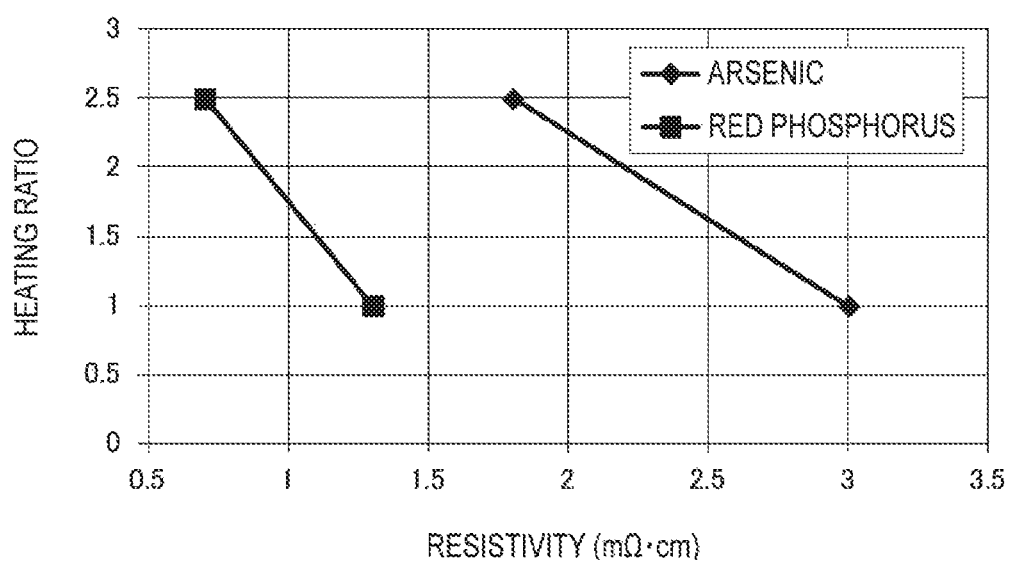
FIG. 5 is a graph related to Experiment 2 in Examples, showing a relationship between a resistivity of a dopant, the heating ratio and dislocation.

In connection with Reference Examples 1 to 4, FIG. 5 shows a relationship between the minimum heating ratio not causing dislocation and the resistivity of the monocrystalline silicon. FIG. 5 shows that heating ratios above a line representing this relationship cause no dislocation, whereas heating ratios below the line cause dislocation.

As shown in FIG. 5, it has been demonstrated that the heating ratio not causing dislocation increases with a reduction in the resistivity of the monocrystalline silicon.

The invention claimed is:

1. A production method of a monocrystalline silicon according to a Czochralski process with use of a monocrystal pull-up apparatus, the apparatus comprising:
    a chamber;
    a crucible located in the chamber;
    a heater configured to heat the crucible to produce a dopant-added melt comprising a silicon melt and a dopant added to the silicon melt; and
    a pull-up unit configured to pull up a seed crystal after bringing the seed crystal into contact with the dopant-added melt,
    wherein the heater comprises an upper heater configured to heat an upper side surface of the crucible and a lower heater configured to heat a lower side surface of the crucible,
    the method comprising:
    forming a neck of the monocrystalline silicon;
    forming a shoulder of the monocrystalline silicon; and
    forming a straight body of the monocrystalline silicon, wherein:
    in the forming of the neck, the seed crystal is brought into contact with the dopant-added melt while the crucible is heated such that a heating ratio, which is calculated by dividing a volume of heat from the lower heater by a volume of heat from the upper heater, becomes 1.5 or less, and
    in the forming of the shoulder, the shoulder is formed by heating the crucible such that the heating ratio increases from a predetermined value of 1 or more.

2. The production method of the monocrystalline silicon according to claim 1, wherein in the forming of the shoulder, the shoulder is formed by heating the crucible such that the heating ratio becomes 2 or more.

3. The production method of the monocrystalline silicon according to claim 1, wherein in the forming of the shoulder, the crucible is heated such that the heating ratio increases from a predetermined value of 1.5 or less until a timing when a diameter of the shoulder being formed reaches a half of a target diameter of the straight body or more and, at or after the timing, heated such that the heating ratio becomes 2 or more.

4. The production method of the monocrystalline silicon according to claim 1, wherein:
    the dopant is arsenic or red phosphorus,
    when the dopant is arsenic, the dopant is added to the silicon melt such that a resistivity of the monocrystalline silicon falls in a range from 1.5 mΩ·cm to 3.5 mΩ·cm, and
    when the dopant is red phosphorus, the dopant is added to the silicon melt such that the resistivity of the monocrystalline silicon falls in a range from 0.6 mΩ·cm to 1.2 mΩ·cm.

* * * * *